United States Patent
Hooper et al.

(10) Patent No.: US 9,638,597 B2
(45) Date of Patent: May 2, 2017

(54) DIFFERENTIAL PRESSURE SENSOR ASSEMBLY

(71) Applicants: Stephen R. Hooper, Mesa, AZ (US); Darrel R. Frear, Phoneix, AZ (US); Thomas C. Speight, Chandler, AZ (US)

(72) Inventors: Stephen R. Hooper, Mesa, AZ (US); Darrel R. Frear, Phoneix, AZ (US); Thomas C. Speight, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 248 days.

(21) Appl. No.: 14/495,095

(22) Filed: Sep. 24, 2014

(65) Prior Publication Data
US 2016/0084722 A1    Mar. 24, 2016

(51) Int. Cl.
*G01L 9/00* (2006.01)
*G01L 13/02* (2006.01)
*G01L 19/04* (2006.01)
*G01L 19/06* (2006.01)

(52) U.S. Cl.
CPC .......... *G01L 9/0052* (2013.01); *G01L 13/025* (2013.01); *G01L 19/04* (2013.01); *G01L 19/069* (2013.01)

(58) Field of Classification Search
CPC ..... G01L 9/0052; G01L 13/025; G01L 19/04; G01L 19/069
See application file for complete search history.

(56) References Cited

U.S. PATENT DOCUMENTS

| | | | | |
|---|---|---|---|---|
| 5,646,072 A * | 7/1997 | Maudie | ............... | G01L 19/147 438/51 |
| 5,663,506 A * | 9/1997 | Moore | ............... | G01L 9/0075 73/708 |
| 6,148,673 A * | 11/2000 | Brown | ............... | G01L 19/0038 257/676 |
| 7,762,141 B2 * | 7/2010 | Tanaka | ............... | G01L 9/0042 29/852 |
| 8,307,714 B1 * | 11/2012 | Hooper | ............... | G01L 13/025 73/754 |
| 8,359,927 B2 * | 1/2013 | Hooper | ............... | B81B 7/0061 73/715 |
| 8,686,550 B2 | 4/2014 | Mcdonald et al. | | |

(Continued)

FOREIGN PATENT DOCUMENTS

CN    102331325 A    1/2012
DE    EP000167941 A2 *    1/1986

*Primary Examiner* — Francis Gray

(57) ABSTRACT

A differential pressure sensor assembly includes a transducer having a first sensing surface and a second sensing surface. The second sensing surface is contained in a cavity. An Integrated Circuit (IC) is hermetically coupled to the transducer. The IC has a first aperture aligned to the cavity. A lead frame is coupled to the IC. The lead frame has a second aperture aligned to the first aperture of the IC. A package encapsulates the transducer, the IC and the lead frame. The package has a third aperture exposed to the first sensing surface. The package includes a molding compound providing a hermetic seal between the third aperture of the package and the first aperture of the IC. The molding compound is separated from the transducer by an encroachment distance.

20 Claims, 5 Drawing Sheets

(56) References Cited

U.S. PATENT DOCUMENTS

| | | | |
|---|---|---|---|
| 2010/0199777 A1* | 8/2010 | Hooper | G01L 19/0084 |
| | | | 73/721 |
| 2013/0264662 A1* | 10/2013 | Baldo | B81B 7/0061 |
| | | | 257/415 |
| 2015/0137279 A1* | 5/2015 | Tiu | H01L 23/49575 |
| | | | 257/415 |
| 2015/0247773 A1* | 9/2015 | Wagner | G01L 9/0052 |
| | | | 73/721 |

* cited by examiner

DIFFERENTIAL PRESSURE SENSOR ASSEMBLY

FIELD

The invention relates generally to a differential pressure sensor and more specifically to a manufacturing process and product for a differential pressure sensor encapsulated in a package made with a transfer molding process.

BACKGROUND

Differential pressure sensors provide an electronic signal as a result of measuring a difference between two pressures. One approach to measuring a differential pressure is to use two single-ended sensors where each sensor is "constrained" with a vacuum on one side of a diaphragm or movable membrane. This approach results in very large devices and is expensive, making it unsuitable for many end products such as inhalers or other portable consumer devices.

Another approach to measuring a differential pressure is to route the two pressures being measured to either side of a diaphragm or a movable membrane. Routing the two pressures to the membrane as well as connecting the electrical output of the membrane to a circuit often results in a complicated assembly that is also large and expensive.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
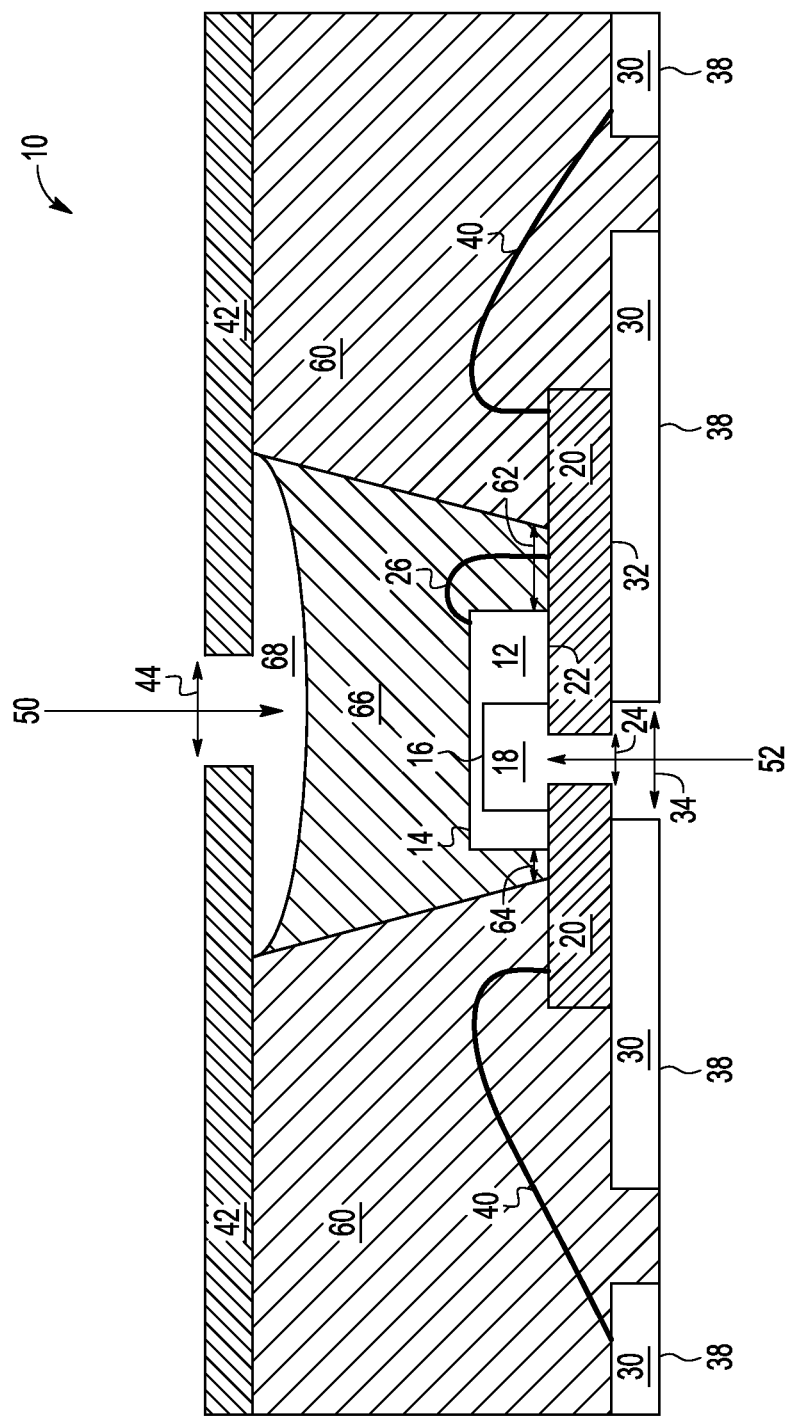
FIG. 1 is a cross-section view of a differential pressure sensor assembly including a wire-bonded piezo-resistive transducer (PRT) with a gel coating on one surface.

Embodiments of systems and methods described herein provide for the sensing of differential pressures in a compact and cost effective assembly suitable for a broad range of markets. An unconstrained pressure transducer (e.g. sensor) provides an electrical response when a difference in pressure is exerted across a diaphragm contained therein. Specifically, one pressure is applied to one side of the diaphragm and a second pressure is applied to the other side of the diaphragm. The diaphragm will deflect in one of two directions with a magnitude proportional to the difference in the two pressures. The amount of deflection is dependent upon the relative magnitudes of the two pressures.

A control circuit receives the electrical response from the pressure transducer. In one embodiment, the control circuit amplifies the response from the pressure transducer for subsequent transmittal to less sensitive circuitry. The control circuit is contained on an Integrated Circuit (IC) that is attached to a bottom side of the pressure transducer (e.g. stacked). Stacking the pressure transducer on top of the IC advantageously improves the signal integrity of the electrical response from the pressure transducer by reducing stray inductance or other parasitic effects. Additionally, the stacked arrangement of the pressure transducer and the IC reduces the size of the overall assembly, particularly compared to an assembly where the pressure transducer and the IC are placed beside each other on a common substrate. Furthermore, including the control circuit on the IC rather than the pressure transducer, allows the control circuit to be separately optimized from the transducer.

A first pressure is exerted directly on the top of the pressure transducer. The second pressure is exerted on the bottom of the pressure transducer through an aperture (e.g. hole) in the underlying IC and through an aligned hole in a lead frame to which the IC is further attached. The pressure transducer, the IC and the lead frame are encapsulated in a package using an assembly process that ensures that the molding compound, used in the package, does not contact the pressure sensor. The molding compound is a dissimilar material to the pressure transducer, which will induce piezoelectric stress thereby reducing the accuracy of the pressure measurement. In one embodiment, the transducer uses piezo-resistive elements, (a Wheatstone bridge for example), to provide an electric signal responsive to a mechanical deflection of the transducer caused by a pressure differential across the transducer. Eliminating contact of the transducer with the molding compound reduces a temperature dependent hysteresis caused by a viscoelastic response of the molding compound (e.g. piezoelectric stress). Accordingly, the linearity and accuracy of the transducer is improved in addition to extending the operating temperature range of the assembly.

Advantageously, the two pressures exerted on the transducer have similar path lengths from the transducer to the exterior of the assembly housing the IC and the transducer. This improves the dynamic pressure balance of the two pressures and provides for a short path for exerting each pressure.

Size is improved by stacking the sensor on top of the control circuit. Size is further improved by providing pressure ports on either side of the assembly. For example, for an inhaler application the two sources of pressure occur on either side of the assembly, thereby additional routing of one of the two sources of pressure is reduced or eliminated.

FIG. 1 shows a differential pressure sensor assembly 10 in accordance with one embodiment of the present disclosure. The assembly 10 includes a pressure transducer 12 having a first sensing surface 14 and a second sensing surface 16. In one embodiment, the transducer 12 is a piezo-resistive transducer (PRT) although other pressure transducers are envisioned to be within the scope of this disclosure. The transducer 12 has a cavity 18, which includes the second sensing surface 16. The transducer 12 is mounted on an IC 20. In various embodiments, the IC is an Application Specific IC (ASIC), a custom IC or a Field Programmable Gate Array (FPGA). Other variants to the IC are realizable wherein the IC controls the transducer and receives a response from the transducer. In one example operation, the IC provides a current bias to a Wheatstone bridge on the transducer 12 and receives a differential voltage proportional to the differential pressure measured by the transducer 12. In another example, the IC converts a response of the transducer 12 to enable a display of the measured differential pressure. In another example, the IC converts a response of the transducer 12 to a data suitable for storage in a non-volatile memory.

The IC 20 is hermetically coupled at an interface 22 to the transducer 12 to the extent that pressure exerted on the first sensing surface 14 has minimal effect on the pressure exerted on the second sensing surface 16. A die attach adhesive provides a hermetic coupling at the interface 22 in one embodiment.

The IC 22 has a passageway, hole or aperture 24 that allows a pressure from outside the assembly 10 to reach the second sensing surface 16. In one embodiment, the aperture 24 is formed with a Deep Reactive-Ion Etching (DRIE) process, which is a highly anisotropic etch process to make deep holes with minimally tapered walls. A minimally tapered wall permits the aperture 24 to have a sufficient width to allow a rapid change of pressure to be exerted on the second sensing surface 16, without unduly consuming surface area on the IC 20. Excessive consumption of surface area on the IC 20 reduces the area available for circuitry contained therein. The aperture 24 is formed by etching from either the front side or the backside of the IC 20. Etching from the backside of the IC 20 advantageously reduces the size of the exit hole of the aperture 24 on the side of the IC 20 containing active circuitry.

In one embodiment, the aperture 24 is substantially circular when viewed from either the front side or the backside of the IC 20. Throughout this disclosure, references to circular apertures are intended to encompass substantially circular apertures with typical variations consistent with the limits of semiconductor fabrication. Similarly, references to the alignment of one aperture to another aperture are intended to encompass substantial alignment consistent with the limits of assembly technology. A circular hole minimizes mechanical stress in the IC 20 as a result of etching the aperture 24.

In another embodiment, the aperture 24 has a rectangular or square shape when viewed from either the front side or the backside of the IC 20. The rectangular or square shape is chosen to avoid encroaching on circuits on the front side of the IC 20. In the various embodiments described herein reference to a larger or smaller aperture means a larger or smaller average area as viewed from either the front side or the backside of the structure containing the aperture (e.g. the IC 20 for the aperture 24).

A wire bond 26 provides an electrical connection from the transducer 12 to the IC 20. In some embodiments a power or ground voltage is supplied to the transducer 12 from the IC 20 by using conductive die attach material at the interface 22. The IC 20 is attached to a lead frame 30 at an interface 32. A hermetic seal is not required at the interface 32 between the IC 20 and the lead frame 30. The lead frame 30 has an aperture 34, being greater than the aperture 24 of the IC 20 when configured as shown in FIG. 1. Specifically, the aperture 24 of the IC is large enough to allow a change in pressure to be transmitted to the cavity 18 where it is sensed by the second sensing surface 16, but small enough to minimize mechanical stress on the IC 20 and to reduce interference with circuitry on the IC 20. The aperture 34 of the lead frame 30 is larger (e.g. the average cross-section area viewed from the front side or the backside is larger) than the aperture 24, to reduce the effects of dynamic pressure when there is a change to the pressure transmitted through the aperture 34 of the lead frame, the aperture 24 of the IC 20 and the cavity 18.

The lead frame 30 includes a bottom surface 38. The IC 20 is electrically attached to the lead frame 30 with at least one wire bond 40. In one embodiment, the lead frame 30 is conductive and transmits the electrical signal received from the wire bond 40 to the bottom surface 38. The assembly 10 further includes a top surface 42, which has an aperture 44.

The aperture 44 is large enough to allow a first pressure 50 to be exerted with minimal response time issues due to dynamic pressure effects. The first pressure 50 and a second pressure 52 each impart a force on the first sensing surface 14 and the second sensing surface 16 respectively, with a net pressure difference being measured by the transducer 12. A space between the top surface 42 and the lead frame 30 is filled with a molding compound 60. In one embodiment, the molding compound 60 is introduced to the assembly 10 with a transfer molding process. In another embodiment, the transfer molding process is a Film-Assisted Molding (FAM) process. The molding compound 60 is chosen to provide mechanical strength to the assembly 10 in addition to providing a hermetic barrier between the first pressure 50 and the aperture 24 of the IC 20, which is hermetically connected to the transducer 12.

Various combinations of aperture size and shape are envisioned within the scope of this disclosure. In one embodiment a diameter of the cavity 18 is nominally 1.1 millimeters and within a range of 300 microns to 2 millimeters, inclusive, the aperture 24 of the IC 20 is nominally 20 microns and within a range of 5 microns to 2 millimeters, inclusive, and the lead frame is nominally 2 millimeters and within a range of 200 microns to 2 millimeters, inclusive.

The molding compound 60 is separated from the transducer 12 by an encroachment distance 62 where the wire bond 26 is formed, and by an encroachment distance 64 where no wire bond exists. In one embodiment, the encroachment distance 62 is the same as the encroachment distance 64 within the tolerance limits of the chosen assembly technology. By separating the molding compound 60 from the transducer 12, the accuracy of the assembly 10 is improved. The molding compound 60 typically has viscoelastic properties that impart a temperature depending stress on the transducer 12 that, if allowed to contact, would introduce an undesirable hysteresis. The molding compound 60 is shown having a sloped wall from the IC 20 to the top surface 42 of the assembly 10, which facilitates the use of the FAM process but is not limited to such. Either a vertical wall or a curved wall is also suitable to provide the mechanical strength and hermeticity provided by the molding compound 60. The encroachment distance 62 and the encroachment distance 64 are dependent on the thickness of the molding compound 60 and a size of the IC 20. In one embodiment, the encroachment distance 62 and the encroachment distance 64 are both 200 microns.

A gel coating 66 covers the transducer 12 and the front side portion of the IC 20 that is not covered by the molding compound 60. The gel coating 66 provides a barrier to corrosive media but with sufficient elasticity to transmit the pressure 50 to the first sensing surface 14. In one example of an application having a corrosive media, the assembly 10 is used as a differential pressure sensor in a digital inhaler. The gel coating 66 prevents the moisture from the breath of the user from oxidizing the transducer 12 and the IC 20. The gel coating 66 need not completely fill the space between the molding compound 60 and the top surface 42 of the assembly 10. A thickness of the gel coating 66 over the transducer 12 and the IC 20 need only be sufficient to provide a protective barrier with the remaining space 68 left exposed directly to the aperture 44.

Figure 2:
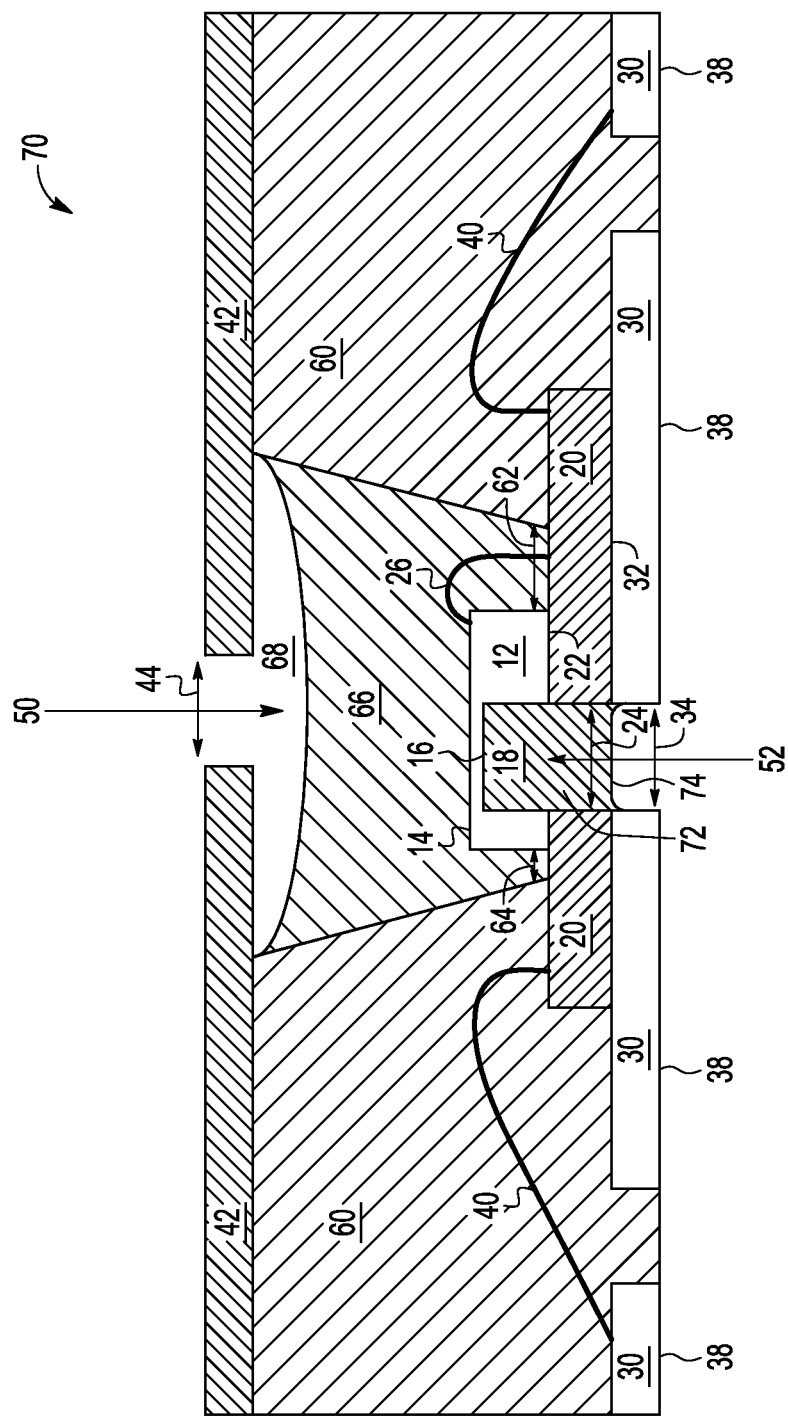
FIG. 2 is a cross-section view of a differential pressure sensor assembly including a wire-bonded PRT with a gel coating on two surfaces.

FIG. 2 shows an embodiment of an assembly 70 similar to the assembly 10 of FIG. 1 while configured for use in a more hostile environment where additional gel coating protection is desirable. The assembly 70 includes the gel coating 66 on a side of the transducer 12 including the first sensing surface 14, in addition to a gel coating 72 contained in the cavity 18 with the second sensing surface 16 and covering a formerly exposed aperture 24 of the IC 20. The gel coating 72 extends to a gel surface 74 to cover the aperture 24 of the IC 20. In contrast to the assembly 10 of FIG. 1, the aperture 24 of the IC 20 and the aperture 34 of the lead frame 30 are adjusted to have a same diameter (if the aperture is circular) or width (if the aperture is square). In one embodiment, the aperture 24 of the IC 20 and the aperture 34 of the lead frame 30 are the same size (within manufacturing limits) to facilitate applying the gel coating 72. In another embodiment, the aperture 24 of the IC 20 and the aperture 34 of the lead frame 30 have a slight variation in size and shape usable with a low viscosity gel coating 72.

Figure 3:
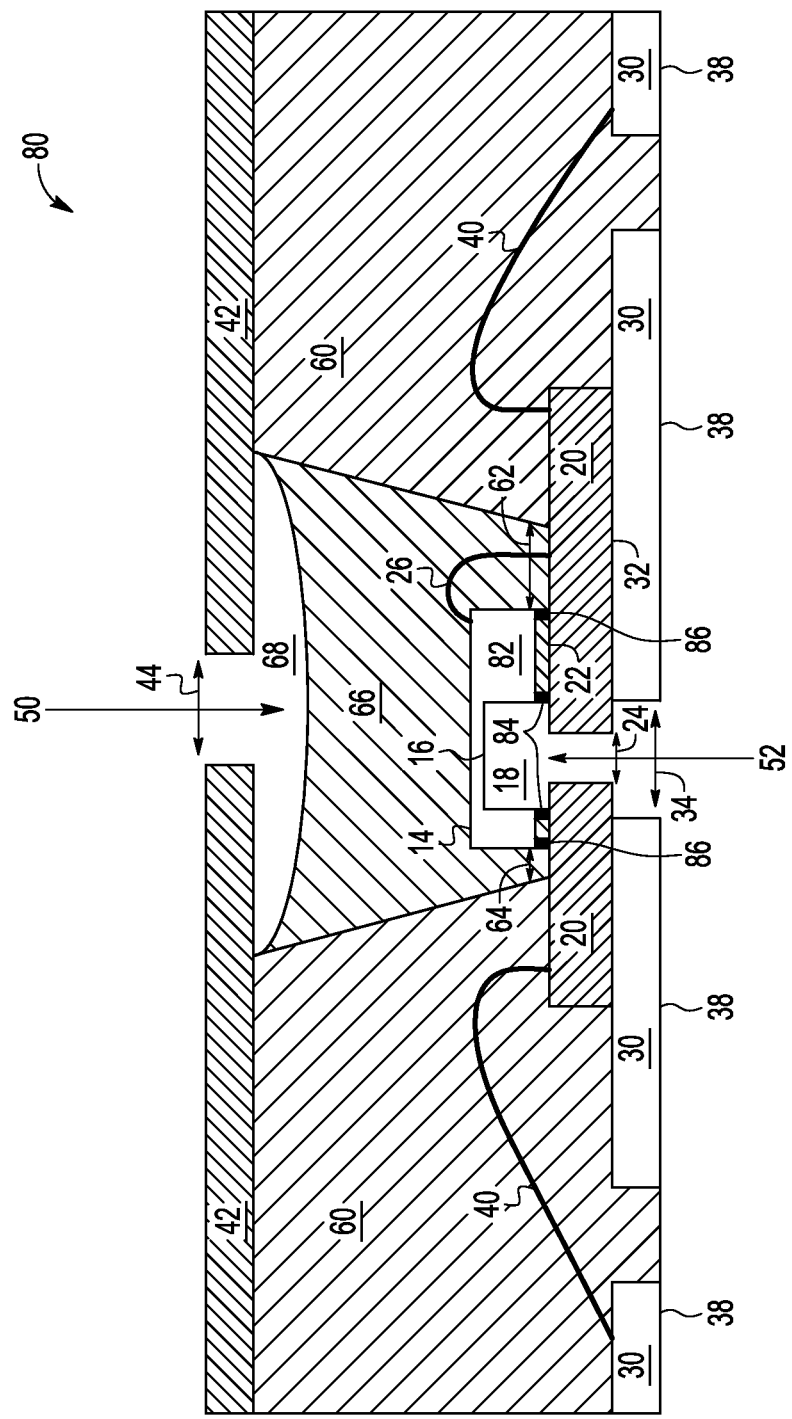
FIG. 3 is a cross-section view of a differential pressure sensor assembly using flip-chip bonding of the PRT.

FIG. 3 shows an embodiment of an assembly 80 similar to the assembly 10 of FIG. 1 while configured to use a transducer 82 that is mounted to the IC 20 with flip-chip technology. The transducer 82 includes metallic bumps 86 (for example solder bumps) to electrically and physically connect the transducer 82 to the IC 20. The transducer also includes a seal 84 proximally located near the cavity 18 to provide a hermetic barrier or seal between the pressure 50 transmitted through the gel coating 66 and the second sensing surface 16 of the transducer 12. In one embodiment, the gel coating extends between the seal 84 and the perimeter of the transducer 82. In one embodiment, the metallic bumps 86 are on the perimeter of the transducer 82. In another embodiment, the metallic bumps 86 are distributed between the seal 84 and the perimeter of the transducer 82.

Figure 4:
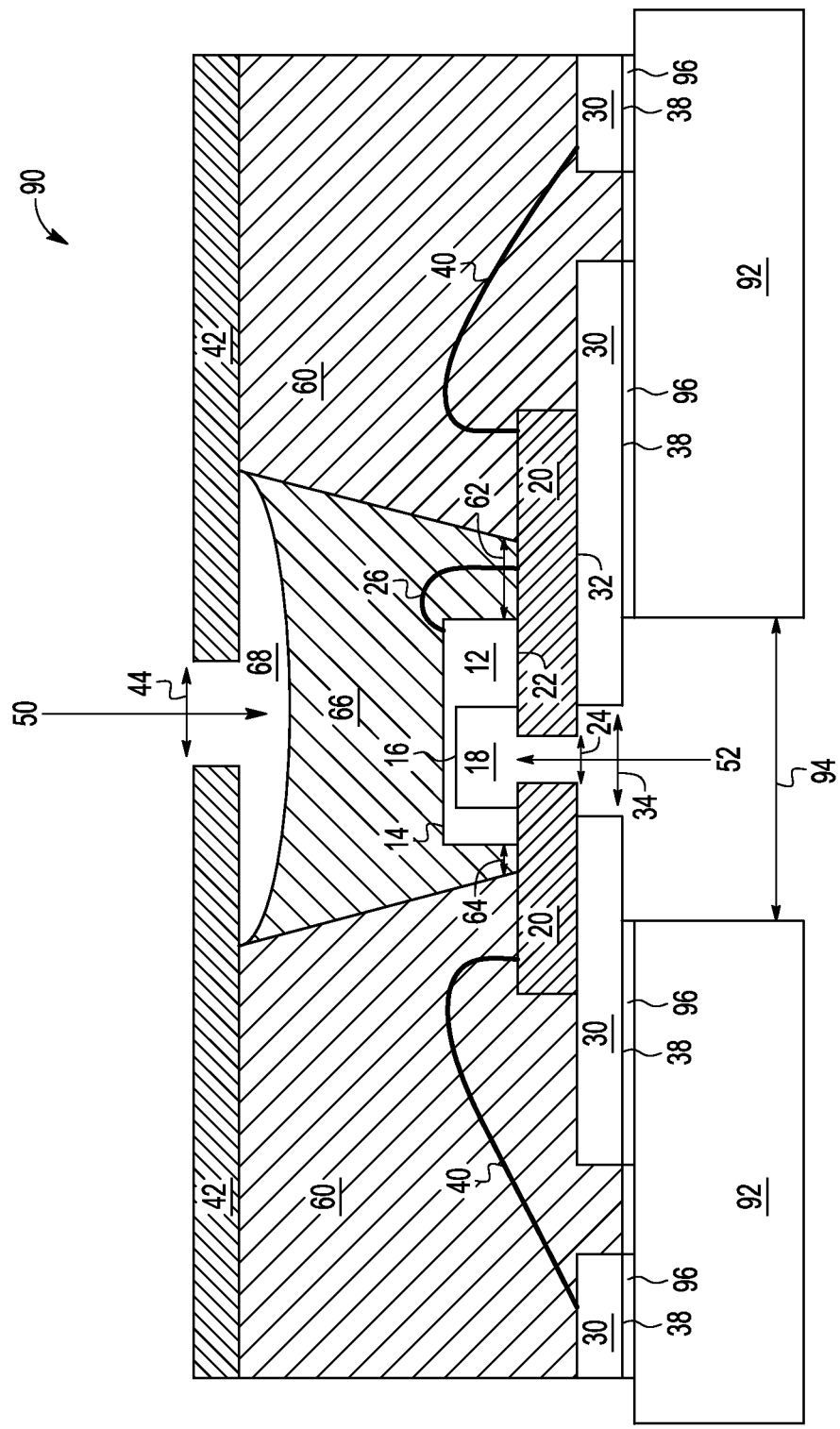
FIG. 4 is a cross-section view of a differential pressure sensor system including the wire-bonded PRT of FIG. 1.

FIG. 4 shows a differential pressure sensing system 90 using the assembly 10 of FIG. 1. The bottom surface 38 of the lead frame 30 is attached to a Printed Circuit Board (PCB) 92 with a conductive attachment 96 (e.g. solder) that connects the electrical connections from the bottom surface 38 to the PCB 92. The PCB 92 has an aperture 94 to enable the pressure 52 to reach the second sensing surface 16. In one embodiment, the aperture 94 is larger than the aperture 34 of the lead frame 30, regardless of whether the system 90 uses the assembly 10 of FIG. 1, the assembly 70 of FIG. 2 or the assembly 80 of FIG. 3.

Figure 5:
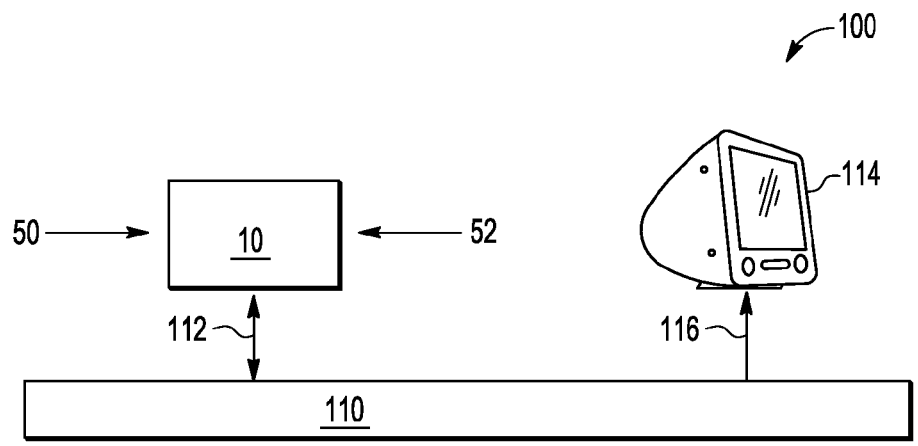
FIG. 5 is a schematic view of a differential pressure sensor system.

FIG. 5 shows a differential pressure sensing system 100 including the assembly 10 of FIG. 1. The assembly 10 is shown for illustrative purposes and should not be construed as limiting the system 100 to this embodiment. Alternative embodiments of the system 100 will use the assembly 70 of FIG. 2 or the assembly 80 of FIG. 3. The system 100 measures a difference in the pressure 50 and the pressure 52 with the assembly 10. The assembly 10 communicates with a PCB 110 with an electrical connection 112. The system 100 includes a display 114 (e.g. an LCD or plasma screen) by receiving an electrical signal 116 from the PCB 110. The display 114 displays the differential pressure measured by the assembly 10. In another embodiment, the display 114 is replaced by a storage device (e.g. a non-volatile FLASH memory) to record various measurements of differential pressure for later use. In another embodiment, the PCB 110 includes additional components that communicate with the assembly 10.

Figure 6:
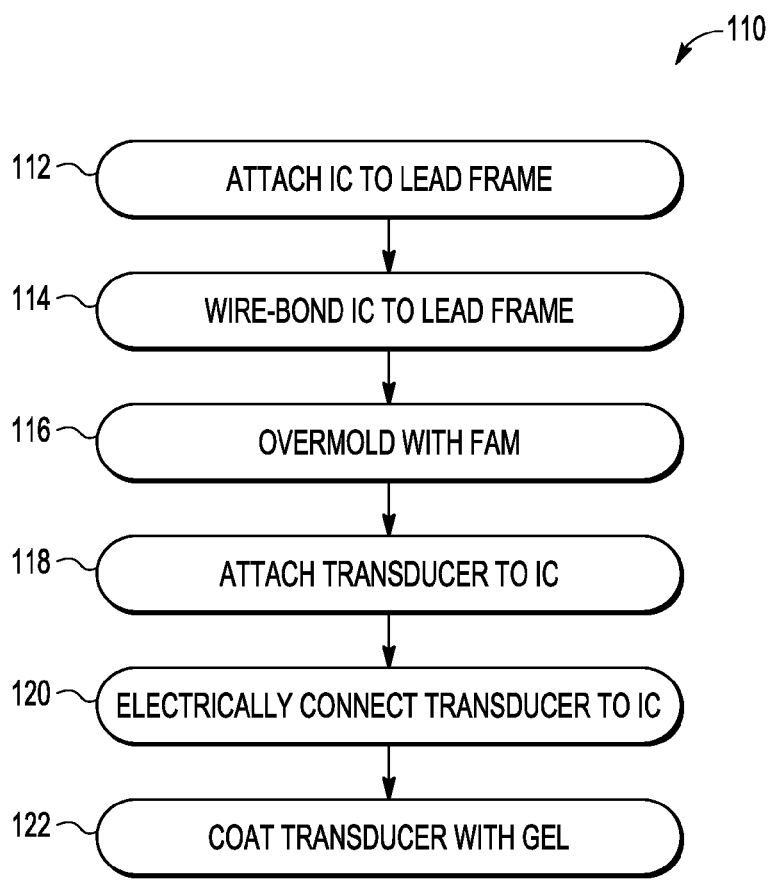
FIG. 6 is a flowchart representation of a method for manufacturing the differential pressures sensor assembly of FIG. 1, FIG. 2 or FIG. 3.

FIG. 6 is a flowchart showing a method 110 of manufacturing the assembly 10 of FIG. 1, the assembly 70 of FIG. 2 or the assembly 80 of FIG. 3. With reference to FIG. 1 and FIG. 6. a process for manufacturing the assembly 10 (and similarly the assembly 70 or 80) is described as follows. At step 112, the IC 20 is attached to the lead frame 30. At step 114, the IC 20 is wire bonded to the lead frame 30. At step 116, the assembly 10 is filled with a molding compound 60 (e.g. the IC 20 and the lead frame 30 are overmolded with the molding compound 60). In one embodiment, the FAM process is used for step 116.

At step 118, the transducer 12 is attached to the IC 20. At step 120, the transducer 12 is electrically connected to the IC 20. "Attaching" means connecting the transducer 12 to the IC 20 with a die attach material. For an embodiment using the assembly 80 of FIG. 3, "attaching" means connecting the transducer 82 to the IC 20 with the seal 84. "Electrically connecting" means wire-bonding the transducer 12 to the IC 20 with a wire bond 26. For an embodiment using the assembly 80 of FIG. 3, "electrically connecting" means connecting the transducer 82 to the IC 20 with the metallic bumps 86.

At step 122, the transducer 12 and IC 20 are coated with a gel coating 66. For an embodiment using the assembly 70 of FIG. 2, step 122 further includes coating the transducer 12 and IC 20 with a gel coating 72. For an embodiment of the assembly 80 of FIG. 3, the transducer 82 and IC 20 is coated with a gel coating 66. An alternative embodiment of the assembly 80 of FIG. 3 includes a second gel coating 72 applied in a manner similar to FIG. 2, including making the aperture 24 of the IC 20 the same size as the aperture 34 of the lead frame 30.

As will be appreciated, embodiments as disclosed include at least the following. In one embodiment a differential pressure sensor assembly comprises a transducer having a first sensing surface and a second sensing surface. The second sensing surface is contained in a cavity. An Integrated Circuit (IC) is hermetically coupled to the transducer. The IC has a first aperture aligned to the cavity. A lead frame is coupled to the IC. The lead frame has a second aperture aligned to the first aperture of the IC. A package encapsulates the transducer, the IC and the lead frame. The package has a third aperture exposed to the first sensing surface. The package includes a molding compound providing a hermetic seal between the third aperture of the package and the first aperture of the IC. The molding compound is separated from the transducer by an encroachment distance.

Alternative embodiments of the differential pressure sensor assembly include one of the following features, or any combination thereof. The transducer is a piezo-resistive pressure transducer. The transducer is wire bonded to the IC to form an electrical communication path therebetween. The IC is hermetically coupled to the transducer with a seal proximal to the cavity of the transducer, and the transducer communicates electrically with the IC through metallic bumps. A first gel coating covers the first sensing surface of the transducer, and the first gel coating is configured to provide a moisture barrier and to transmit a pressure from the third aperture of the package to the first sensing surface of the transducer. A first diameter of the first aperture of the IC is equal to a second diameter of the second aperture of the lead frame, a second gel coating covers the second sensing surface of the transducer, and the second gel coating is configured to provide a moisture barrier and to transmit a pressure from the second aperture of the lead frame to the second sensing surface of the transducer. The first aperture of the IC is circular.

In another embodiment, a differential pressure sensor system comprises a package encapsulating a piezo-resistive transducer (PRT), an Integrated Circuit (IC) and a lead frame. The PRT has a first sensing surface and a second sensing surface. The second sensing surface is contained in a cavity. The IC is hermetically coupled to the PRT. The IC has a first aperture aligned to the cavity. The lead frame is coupled to the IC. The lead frame has a second aperture aligned to the first aperture of the IC. The package has a third aperture exposed to the first sensing surface. The package includes a molding compound providing a hermetic seal between the third aperture of the package and the first aperture of the IC. The molding compound is separated from the transducer by an encroachment distance. A Printed Circuit Board (PCB) is coupled to the package. The PCB has a fourth aperture aligned to the second aperture of the lead frame. The PCB provides an electrical communication between the IC and a device configured to receive pressure measurements from the PRT.

Alternative embodiments of the differential pressure sensor system include one of the following features, or any combination thereof. The fourth aperture of the PCB is equal to or larger than the second aperture of the lead frame and the second aperture of the lead frame is larger than the first aperture of the IC. The first aperture of the IC is circular and has a first diameter of 5 microns to 2 millimeters, inclusive. The second aperture of the lead frame is circular and has a second diameter of 200 microns to 2 millimeters, inclusive. Each of the second aperture of the lead frame and the first aperture of the IC are circular with a same diameter, and the second sensing surface of the PRT is covered with a gel coating. The encroachment distance is about 200 microns.

In another embodiment, a method for manufacturing a differential pressure sensor assembly comprises attaching an Integrated Circuit (IC) to a lead frame including aligning a first aperture of the IC with a second aperture of the lead frame. The IC is wire bonded to the lead frame. The IC and the lead frame are overmolded with a molding compound in a package, wherein the molding compound provides a hermetic seal between a third aperture of the package and the first aperture of the IC. The molding compound is separated from the transducer by an encroachment distance. A transducer is hermetically attached to the IC. The transducer is electrically connected to the IC. At least one of two sensing surfaces of the transducer is coated with a gel coating configured to provide a moisture barrier and to transmit a pressure therethrough.

Alternative embodiments of the method for manufacturing a differential pressure sensor assembly include one of the following features, or any combination thereof. Overmolding is performed with a transfer molding process. The transfer molding process is a Film-Assisted Molding process. Attaching the package to a Printed Circuit Board (PCB) includes aligning a fourth aperture of the PCB to the second aperture of the lead frame and providing, by the PCB, an electrical communication between the IC and a device configured to receive pressure measurements from the transducer. Attaching the transducer to the IC includes wire bonding the transducer to the IC. Attaching the transducer to the IC includes attaching the transducer to the IC with a seal proximal to the cavity of the transducer, and electrically coupling the transducer to the IC through metallic bumps. The first aperture of the IC is formed with a Deep Reactive-Ion Etching process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A differential pressure sensor assembly comprising:
   a transducer having a first sensing surface and a second sensing surface, the second sensing surface contained in a cavity;
   an Integrated Circuit (IC) hermetically coupled to the transducer, the IC having a first aperture aligned to the cavity;
   a lead frame coupled to the IC, the lead frame having a second aperture aligned to the first aperture of the IC; and
   a package encapsulating the transducer, the IC and the lead frame, the package having a third aperture exposed to the first sensing surface, the package including a molding compound providing a hermetic seal between the third aperture of the package and the first aperture of the IC, and the molding compound separated from the transducer by an encroachment distance.

2. The assembly of claim 1 wherein the transducer is a piezo-resistive pressure transducer.

3. The assembly of claim 1 wherein the transducer is wire bonded to the IC to form an electrical communication path therebetween.

4. The assembly of claim 1 wherein the IC is hermetically coupled to the transducer with a seal proximal to the cavity of the transducer, and the transducer communicates electrically with the IC through metallic bumps.

5. The assembly of claim 1 wherein a first gel coating covers the first sensing surface of the transducer, and the first gel coating is configured to provide a moisture barrier and to transmit a pressure from the third aperture of the package to the first sensing surface of the transducer.

6. The assembly of claim 5 wherein a first diameter of the first aperture of the IC is equal to a second diameter of the second aperture of the lead frame, a second gel coating covers the second sensing surface of the transducer, and the second gel coating is configured to provide a moisture barrier and to transmit a pressure from the second aperture of the lead frame to the second sensing surface of the transducer.

7. The assembly of claim 1 wherein the first aperture of the IC is circular.

8. A differential pressure sensor system comprising:
   a package encapsulating a piezo-resistive transducer (PRT), an Integrated Circuit (IC) and a lead frame, the PRT having a first sensing surface and a second sensing surface, the second sensing surface contained in a cavity, the IC hermetically coupled to the PRT, the IC having a first aperture aligned to the cavity, the lead frame coupled to the IC, the lead frame having a second aperture aligned to the first aperture of the IC, the package having a third aperture exposed to the first sensing surface, the package including a molding compound providing a hermetic seal between the third aperture of the package and the first aperture of the IC, and the molding compound separated from the transducer by an encroachment distance; and
   a Printed Circuit Board (PCB) coupled to the package, the PCB having a fourth aperture aligned to the second aperture of the lead frame, and the PCB providing electrical communication between the IC and a device configured to receive pressure measurements from the PRT.

9. The system of claim 8 wherein the fourth aperture of the PCB is equal to or larger than the second aperture of the lead frame and the second aperture of the lead frame is larger than the first aperture of the IC.

10. The system of claim 9 wherein the first aperture of the IC is circular and has a first diameter of 5 microns to 2 millimeters, inclusive.

11. The system of claim 9 wherein the second aperture of the lead frame is circular and has a second diameter of 200 microns to 2 millimeters, inclusive.

12. The system of claim 8 wherein each of the second aperture of the lead frame and the first aperture of the IC are circular with a same diameter, and the second sensing surface of the PRT is covered with a gel coating.

13. The system of claim 8 wherein the encroachment distance is about 200 microns.

14. A method for manufacturing a differential pressure sensor assembly comprising:
attaching an Integrated Circuit (IC) to a lead frame including aligning a first aperture of the IC with a second aperture of the lead frame;
wire bonding the IC to the lead frame;
overmolding the IC and the lead frame with a molding compound in a package, wherein the molding compound provides a hermetic seal between a third aperture of the package and the first aperture of the IC, the molding compound being separated from the transducer by an encroachment distance;
hermetically attaching a transducer to the IC;
electrically connecting the transducer to the IC; and
coating at least one of two sensing surfaces of the transducer with a gel coating configured to provide a moisture barrier and to transmit a pressure therethrough.

15. The method of claim 14 wherein overmolding is performed with a transfer molding process.

16. The method of claim 15 wherein the transfer molding process is a Film-Assisted Molding process.

17. The method of claim 14 further comprising attaching the package to a Printed Circuit Board (PCB) including aligning a fourth aperture of the PCB to the second aperture of the lead frame and providing, by the PCB, an electrical communication between the IC and a device configured to receive pressure measurements from the transducer.

18. The method of claim 14 wherein attaching the transducer to the IC includes wire bonding the transducer to the IC.

19. The method of claim 14 wherein attaching the transducer to the IC includes attaching the transducer to the IC with a seal proximal to the cavity of the transducer, and electrically coupling the transducer to the IC through metallic bumps.

20. The method of claim 14 further comprising forming the first aperture of the IC with a Deep Reactive-Ion Etching process.

* * * * *